United States Patent
Bolatkale et al.

(10) Patent No.: US 10,439,634 B2
(45) Date of Patent: Oct. 8, 2019

(54) SIGMA DELTA MODULATOR, INTEGRATED CIRCUIT AND METHOD THEREFOR

(71) Applicant: NXP B.V., Eindhoven (NL)

(72) Inventors: Muhammed Bolatkale, Rijswijk (NL); Lucien Johannes Breems, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/935,045

(22) Filed: Mar. 25, 2018

(65) Prior Publication Data

US 2019/0245553 A1  Aug. 8, 2019

(30) Foreign Application Priority Data

Jun. 8, 2017  (EP) ..................................... 17175037

(51) Int. Cl.
*H03M 3/00* (2006.01)
*H03M 1/12* (2006.01)
*H03M 1/00* (2006.01)

(52) U.S. Cl.
CPC ........... *H03M 3/424* (2013.01); *H03M 3/464* (2013.01); *H03M 1/001* (2013.01); *H03M 1/12* (2013.01); *H03M 3/30* (2013.01); *H03M 3/412* (2013.01)

(58) Field of Classification Search
CPC .......... H03M 3/30; H03M 1/12; H03M 1/001; H03M 3/412
USPC ............... 341/143, 155, 200, 110, 136, 137; 375/247
See application file for complete search history.

(56) References Cited

U.S. PATENT DOCUMENTS

| | | | |
|---|---|---|---|
| 6,473,019 B1* | 10/2002 | Ruha | H03M 3/3287 341/143 |
| 2004/0145504 A1 | 7/2004 | Doereeer et al. | |
| 2016/0020781 A1 | 1/2016 | Baringer et al. | |
| 2018/0343013 A1 | 11/2018 | Breems et al. | |

OTHER PUBLICATIONS

Non-Final Office Action dated Dec. 28, 2018 for U.S. Appl. No. 15/926,442 6 pgs.

(Continued)

*Primary Examiner* — Joseph J Lauture
(74) *Attorney, Agent, or Firm* — Rajeev Madnawat

(57) ABSTRACT

A multi-bit continuous-time sigma-delta modulator, SDM, includes an input configured to receive an input analog signal; a first summing junction configured to subtract a feedback analog signal from the input analog signal; a loop filter configured to filter an output signal from the first summing junction (304): an analog-to-digital converter, ADC, configured to convert the filtered analog output signal to a digital output signal; and a feedback path for routing the digital output signal to the first summing junction. The feedback path includes a plurality of digital-to-analog converters, DACs, configured to convert the digital output signal to an analog form. The ADC comprises a plurality of N-bit comparator latches that are each locally time-interleaved with at least a pair of latches and configured to function in a complementary manner and provide a combined complementary output.

15 Claims, 5 Drawing Sheets

(56) References Cited

OTHER PUBLICATIONS

Paton, S. et al. A 70-mW 300-MHz CMOS continuous-time /spl Sigma//spl Delta/ ADC with 15-MHz bandwidth and 11 bits of resolution, IEEE Journal of Solid-State Circuits, vol. 39, No. 7, pp. 1056-1063 (Jul. 2004).
Park, C. et al. Efficient Broadband Current-Mode Adder—Quantizer Design for Continuous-Time Sigma-Delta Modulators, IEEE Transactions on Very Large Scale Integration (VLSI) Systems, vol. 23, No. 9, pp. 1920-1930 (Sep. 2015).
Cherry, J.A. et al. "Excess loop delay in continuous-time Delta-Sigma modulators", IEEE Transactions on Circuits and Systems—II: Analog and Digital Signal Processing, vol. 46, No. 4, pp. 376-389 (Apr. 1999).
Bolatkale, M. et al. "A 4 GHz continuous-time $\Delta\Sigma$ ADC with 70 dB DR and -74 dBFS THD in 125 MHz BW", IEEE Journal of Solid-State Circuits, vol. 46, No. 12, pp. 2857-2868 (Dec. 2011).
Dong, Y. et al. "A continuous-time 0-3 MASH ADC achieving 88 dB DR With 53 MHz BW in 28 nm CMOS", IEEE Journal of Solid-State Circuits, vol. 49, No. 12, pp. 2868-2877 (Dec. 2014).
Srinivasan, V. et al. "A 20mW 61dB SNDR (60MHz BW) 1b 3rd-order continuous-time delta-sigma modulator clocked at 6GHz in 45nm CMOS", IEEE Int. Solid-State Circuits Conf. (ISSCC) Dig. Tech. Papers, pp. 158-160 (2012).
Park, C. J. et al. "Efficient Broadband Current-Mode Adder—Quantizer Design for Continuous-Time Sigma-Delta Modulators", IEEE Transactions on Very Large Scale Integration (VLSI) Systems, vol. 23, No. 9, pp. 1920-1930 (Sep. 2015).
Paton, S. et al. "A 70-mW 300-MHz CMOS continuous-time $\Sigma\Delta$ ADC with 15-MHz bandwidth and 11 bits of resolution", IEEE Journal of Solid-State Circuits, vol. 39, No. 7, pp. 1056-1063 (Jul. 2004).
Jiang, F et al. "Beyond-one-cycle loop delay CT $\Delta\Sigma$ modulators with proper rational NTF synthesis and time-interleaved quantizers", IEEE 56th International Midwest Symposium on Circuits and Systems (MWSCAS), Columbus, OH, pp. 558-561 (2013).
Zhang, C. et al. "Current-mode multi-path excess loop delay compensation for GHz sampling CT $\Sigma\Delta$ ADCs", IEEE International Symposium on Circuits and Systems (ISCAS), Baltimore, MD, pp. 1-4 (2017).
Final Office Action dated Mar. 11, 2019 for U.S. Appl. No. 15/926,442 6 pgs.
Non-Final for U.S. Appl. No. 15/926,442 (dated Jun. 13, 2019).
Notice of Allowance for U.S. Appl. No. 15/926,442, 5 pgs. (dated Jul. 26, 2019).

* cited by examiner

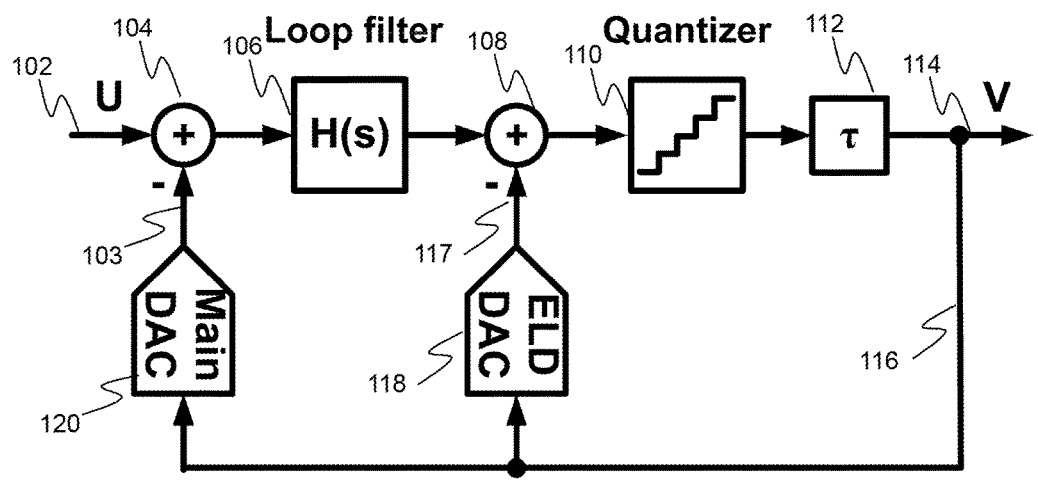
FIG. 1 – Prior Art
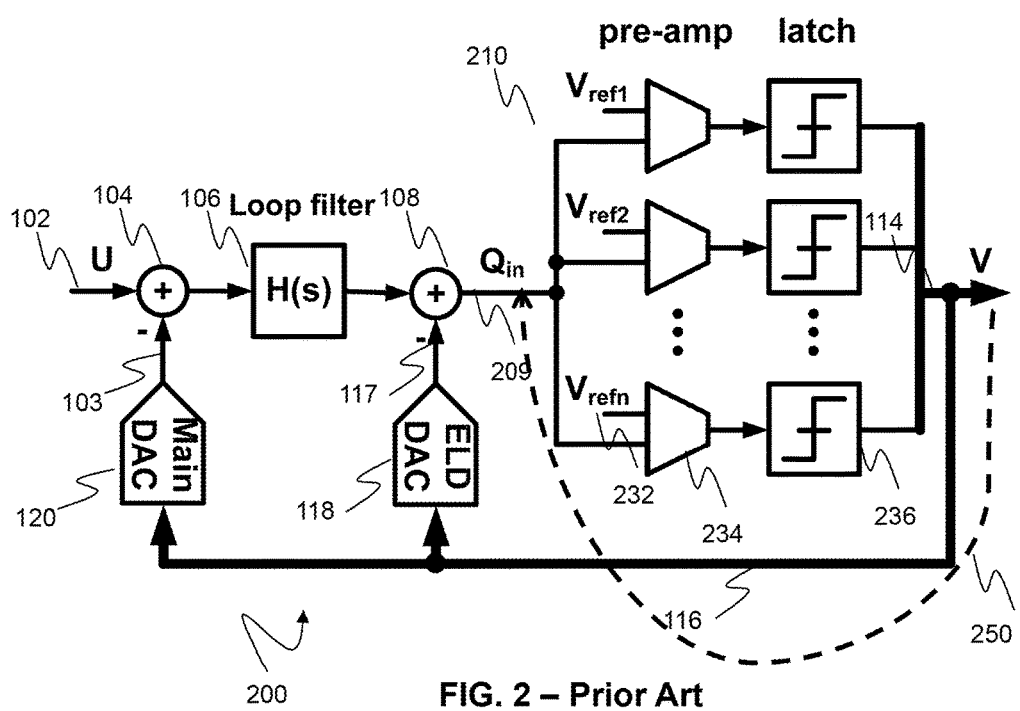
FIG. 2 – Prior Art

SIGMA DELTA MODULATOR, INTEGRATED CIRCUIT AND METHOD THEREFOR

CROSS-REFERENCE TO RELATED APPLICATIONS

This application claims the priority under 35 U.S.C. § 119 of European Patent application no. 17175037.5, filed on Jun. 8, 2017, the contents of which are incorporated by reference herein.

DESCRIPTION

Field of the invention

The field of this invention relates to a sigma-delta modulator, an integrated circuit and method therefor. In particular, the field relates to loop delay compensation for continuous-time sigma-delta ADCs with multi-bit quantization.

Background of the Invention

Analog-to-digital converters (ADCs) with signal bandwidth (BW)>500 MHz and Signal to Noise and Distortion Ratio (SNDR)>60 dB are needed for many applications, such as: base station receivers, automotive ethernet, and next generation 5G cellular telecommunications. Sigma-Delta modulation is a method for encoding analog signals into digital signals, often used in an analog-to-digital converter (ADC) and capable of achieving these performance levels. Sigma-Delta modulation is also used to transfer high bit-count, low frequency, digital signals into lower bit-count, higher frequency, digital signals as part of the process to convert digital signals into analog (i.e. as part of a digital-to-analog converter (DAC)). Sigma-delta ADCs are oversampling ADCs that sample the signal at much higher rates than a Nyquist rate.

In a conventional ADC, an analog signal is integrated, or sampled, with a sampling frequency and subsequently quantized in a multi-level quantizer into a digital signal. This process introduces quantization error noise. The first step in a sigma-delta modulation is delta modulation. In delta modulation the change in the signal (i.e. its 'delta') is encoded, rather than the absolute value. The result is a stream of pulses, as opposed to a stream of numbers, as is the case with pulse code modulation. In sigma-delta modulation, the accuracy of the modulation is improved by passing the digital output through a 1-bit DAC and adding (sigma) the resulting analog signal, to the input signal (the signal before delta modulation), thereby reducing the error introduced by the delta-modulation.

Discrete-time ADCs implemented using switched-capacitor circuits have been the designer's choice for the last few decades. However, recently, continuous-time sigma-delta ADCs have gained popularity in technical journals and the industry. Continuous-time sigma-delta ADCs with multi-bit quantization are popular for bandwidths (BW) larger than 100 MHz. Multi-bit quantization has the advantages of lower quantization noise, relaxed clock jitter requirement, and it allows the designers to use more aggressive noise transfer functions (NTFs). The principle of noise shaping and oversampling in continuous-time sigma-delta ADCs remains the same as its discrete-time counterpart. The key difference between a continuous-time sigma-delta ADC and a discrete time sigma-delta ADC is where the sampling operation takes place. In the continuous-time design, input sampling takes place just before the quantizer. The loop filter is now continuous-time using continuous-time integrators, often resistor-capacitor (RC) or transconductance-capacitor (gm/C) integrators.

Continuous-time sigma-delta ADCs contain one or multiple sigma-delta modulators (SDMs). A SDM is a feedback loop containing a loop filter, the quantizer, and the feedback DAC(s). The function of the quantizer is sampling and quantization. Its input signal is continuous in time domain and continuous in voltage (or current) domain, i.e. a continuous-time, continuous-value (analog signal). Its output signal should be discrete in time domain and discrete in voltage domain, i.e. discrete-time discrete-value (digital signal). The function of the main feedback DAC is a zero-order hold, which converts the digital signal to analog signal.

Excess loop delay (ELD) is a known phenomenon in continuous-time sigma-delta ADCs, as described in J. A. Cherry and W. M. Snelgrove, "Excess loop delay in continuous-time Delta-Sigma modulators", IEEE Transactions on Circuits and Systems—II: Analog and Digital Signal Processing, vol. 46, no. 4, pp. 376-389, Apr. 1999. Generally, the loop delay contains the regeneration time of the quantizer, the delay of the feedback DACs and the delay of the circuit between the quantizer and DACs. For high-speed continuous-time Sigma-Delta ADCs, the excess loop delay can be as large as one quantizer sampling clock period (1 $T_s$). The excess loop delay can deteriorate the resolution of the continuous-time sigma-delta ADCs, or even make it unstable. One known technique to compensate the excess loop delay is to add a direct feedback path through an ELD DAC around the quantizer itself, as shown in FIG. 1.

Referring to FIG. 1, a block diagram of part of a continuous-time sigma-delta ADC 100 with quantization and ELD compensation is illustrated. The continuous-time sigma-delta ADC 100 includes an input signal 102 and whereby a main feedback signal 103 is subtracted from the input signal 102 in first summing junction 104. The resultant signal is input to a loop filter 106 and a feedback ELD compensation signal 117 subtracted therefrom in a second summing junction 108. The analog signal output from the second summing junction 108 is input to a quantizer 110, such as an ADC and input to a delay 112. The output of the delay 112 is the output 114 of the sigma-delta ADC 100. The output 114 is fed back 116 to an ELD DAC 118, to generate the ELD compensation signal 117 to be input to the second summing junction 108. The ELD compensation is typically implemented by a capacitive DAC and the capacitor of an RC integrator. The feedback 116 is also fed back to a main DAC 120 to generate an analog version of the output signal 114 to be input to first summing junction 104 and thereby form a feedback loop. Notably, an amplifier of the RC integrator is located in the fast feedback loop. However, the amplifiers in the fast feedback loop have very high gain bandwidth (GBW) requirements and they are very power hungry.

Referring now to FIG. 2, a known example of a conventional SDM system architecture 200 with multi-bit quantization and ELD compensation is illustrated. Conventionally, the ELD DAC 118 has a voltage output, and the output of the loop filter 106 is also in the voltage domain. These two voltage signals are summed in summing junction 108, sometimes with a summation amplifier, as described in M. Bolatkale, L. Breems, R. Rutten and K. Makinwa, titled 'A 4 GHz continuous-time ΔΣ ADC with 70 dB DR and −74 dBFS THD in 125 MHz BW', published in IEEE Journal of Solid-State Circuits, vol. 46, no. 12, pp. 2857-2868, Dec. 2011, or with passive components, as described in Y. Dong, W. Yang, R. Schreier, A. Sheikholeslami and S. Korrapati, titled 'A continuous-time 0-3 MASH ADC achieving 88 dB DR With 53 MHz BW in 28 nm CMOS', published in IEEE Journal of Solid-State Circuits, vol. 49, no. 12, pp. 2868-2877, Dec. 2014. The resultant output 209 from the summing junction 108 is the input voltage of the quantizer, which in this figure is shown as a multi-bit comparator $Q_{in}$ 210 Here, $Q_{in}$ 209 is compared with several reference voltages $V_{ref1}, V_{ref2}, \ldots, V_{refn}$ 232 in several pre-amplifiers 234. The differences between $Q_{in}$ 209 and $V_{ref1}, V_{ref2}, \ldots, V_{refn}$ 232 are amplified by the gain of the pre-amplifiers 234. These amplified signals are passed to respective latches 236, and are further amplified by the positive feedback of the latches 236. The outputs of the latches are the output of the multi-bit comparator 210. These outputs are sampled and passed to the main DAC 120 and ELD DAC 118 via feedback 116.

The loop filter can be in either feed-forward (FF) or feedback (FB) structure. Only one common fast FB path 250 is used for the ELD compensation. In the architecture of FIG. 2, if the total delay of the fast feedback path 250 through the multi-bit comparator 210 and ELD DAC 118 is less than a single sampling time period $T_s$ (and the total delay of the slow feedback path through the multi-bit comparator 210 and the main DAC 120 is no more than one $T_s$), with proper parameters for the SDM, the SDM can be designed to be stable. In this scenario, a suitable resolution of the SDM can be achieved without use of the ELD loop. However, in a scenario of very high speed continuous-time Sigma-Delta ADCs, the pre-amplifiers 234 have to be optimized for less delay, which limits the gain they can offer, whilst consuming a lot of power. Also, the use of such preamplifiers 234 always creates undesirable delay.

Thus, there is a desire to reduce the effects of, or avoid, the delay introduced by such pre-amplifiers 234 in SDMs, and particularly continuous-time sigma-delta ADCs.

SUMMARY OF THE INVENTION

The present invention provides a SDM with multi-bit quantization and ELD compensation, an integrated circuit and method therefor as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 1 illustrates a block diagram of a known continuous-time sigma-delta ADC with excess loop delay compensation.

FIG. 2 illustrates a known example of a conventional SDM system architecture with multi-bit quantization and ELD compensation.

DETAILED DESCRIPTION

Figure 3:
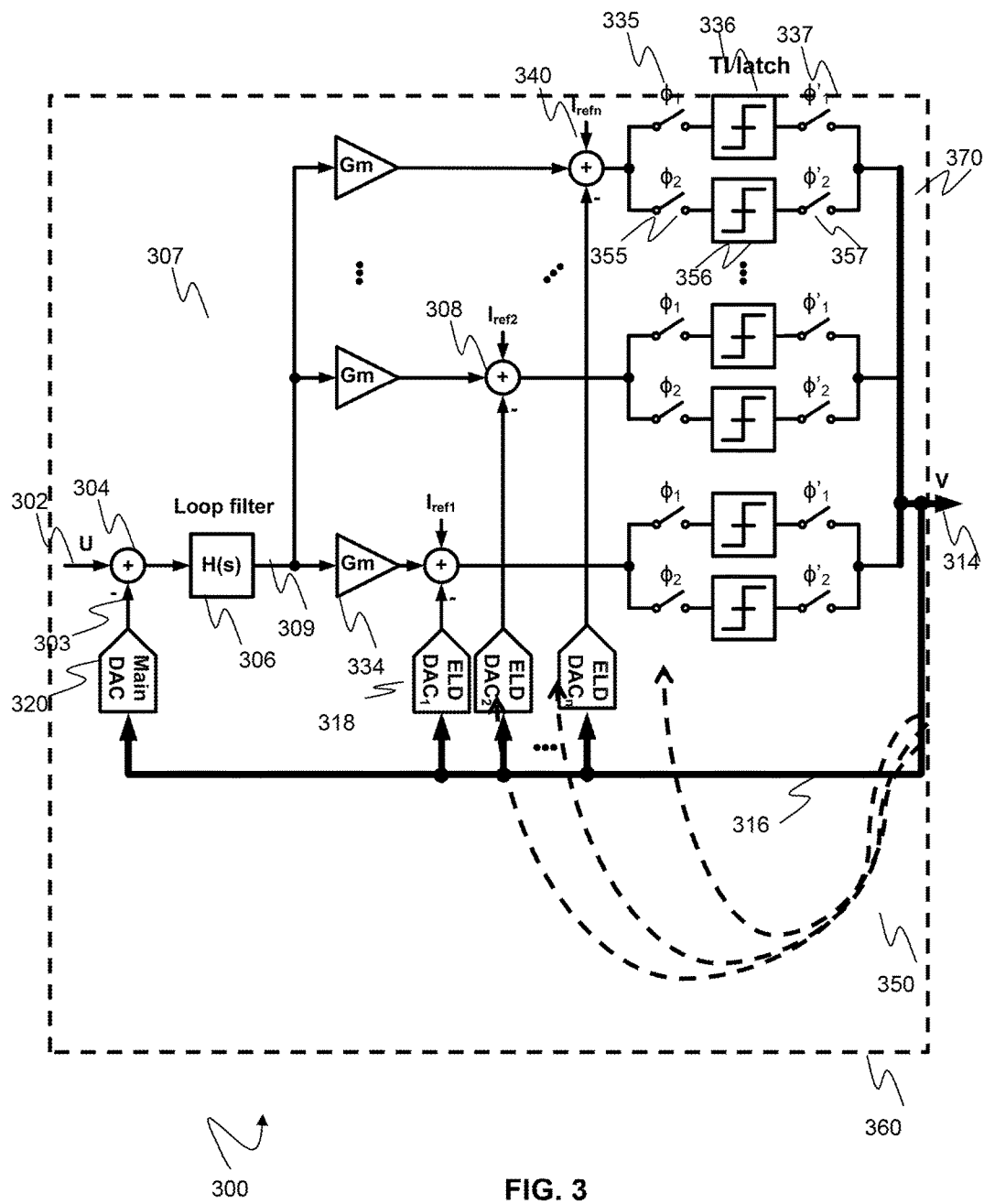
FIG. 3 illustrates an example of a SDM system architecture with multi-bit quantization and ELD compensation and local time-interleaved latches, according to some examples of the invention.

Because the illustrated embodiments of the present invention may, for the most part, be implemented using electronic components and circuits known to those skilled in the art, details will not be explained in any greater extent than that considered necessary to understand and appreciate the underlying concepts of the present invention and, in order not to obfuscate or distract from the teachings of the present invention.

In some examples, a current-mode multi-path excess loop delay compensation for continuous-time sigma-delta ADCs with multi-bit quantization technique is described that removes the need for pre-amplifiers and therefore reduces the effects of the delay of pre-amplifiers in SDMs, and particularly continuous-time sigma-delta ADCs. The proposed system provides a new ELD compensation approach based on multiple fast feedback loops operating in the current domain and an ADC that includes a plurality of N-bit comparator latches that are each locally time-interleaved with at least a pair of latches configured to function in a complementary manner and provide a combined complementary output.

Examples of the invention describe the plurality of paired latches being configured to provide a complementary output whereby alternate latches of the pair are inactivated or activated in an out-of-synchronisation manner. Examples of the invention describe the complementary arrangement between the paired latches such that a first latch of the pair of latches is configured to be in a regeneration mode concurrently with a second latch being configured to be in a reset and mode and acquire a next initial condition. In some examples, the paired latches form a N-bit 1-bit locally time-interleaved comparator and the complementary arrangement between the paired latches provides two ADC sampling periods $(2T_s)$ to achieve the next initial condition, regeneration, and reset operations. Although examples of the invention are, in the main, described with reference to a 1-bit locally time-interleaved comparator, it is envisaged that the concepts herein described apply equally to any number of bit (i.e. N-bit) time-interleaved comparator, as would be appreciated by a skilled artisan.

Furthermore, since the N-bit (or in some examples 1-bit) comparator (latch) is locally time-interleaved, it has 2 $T_s$ to finish three operations (achieve the initial condition, regeneration, reset), instead of 1 $T_s$. Thus, the time to reset and to achieve the initial condition is not within the 1 $T_s$ time budget. Thus, 1 $T_s$ can be completely used for the regeneration phase, and the effective regeneration time of the comparator can be maximized. In addition, the clocking scheme is simpler than the conventional delayed-clocking scheme, which facilitates power efficient clock generation and distribution.

Examples of the invention also describe a duplication of the summation node amongst multiple quantizer paths operating in the current domain. Respective Gm cell and ELD DACs are also duplicated. Instead of comparing the $Q_{in}$ voltage signal with reference voltage signal $V_{ref}$ in the pre-amplifiers, as in the known ELD DAC compensation circuits, a corresponding reference current signal $I_{ref}$ may be added in the same summation nodes. Reference currents are static, pre-selected currents that relate to the voltage reference in the current domain. Thus, the known use of pre-amplifiers, and inherent disadvantages that result therefrom, are removed from the system. The resulting current signal, in examples of the invention, directly drives the paired latches in a form of a comparator latch in a complementary manner.

Examples of the invention provide a multi-bit sigma-delta modulator, SDM, that includes an input configured to receive an input analog signal; a first summing junction configured to subtract a feedback analog signal from the input analog signal; a loop filter configured to filter an output signal from the first summing junction: an analog-to-digital converter, ADC, configured to convert the filtered analog output signal to a digital output signal; and a feedback path for routing the digital output signal to the first summing junction. The feedback path includes a plurality of digital-to-analog converters, DACs, configured to convert the digital output signal to an analog form. The ADC includes a plurality of paired latches configured to function in a complementary manner and provide a combined complementary output. An integrated circuit comprising a continuous-time sigma-delta ADC and a method therefor are also described. In this manner, by employing current-mode multi-path excess loop delay compensation of the respective loop filter outputs, respective ELD DAC outputs and a plurality of paired latches configured to function in a complementary manner and provide a combined complementary output, the pre-amplifier is omitted and its delay prevented.

In this manner, by using the proposed local time-interleaving (TI) concept (using TI comparators, the reset time and the time to take the next initial condition is moved out of the typical 1 $T_s$ time budget. An extra 1 $T_s$ is used to reset and take the next initial condition. The requirement for the reset switch is therefore much relaxed, which allows the size of the reset switch to be reduced, and minimizes the capacitive load on the latch output node. The available effective regeneration time of the comparator latch is determined by $T_s$ and the time to sample and pass the latch output to the ELD DAC and main DAC is therefore maximized. Thus, with the same power consumption of the comparator latch, it offers more quantization gain, which reduces the chance of comparator metastability error.

Furthermore, the clock signals are simplified compared with the state-of-the-art approaches, for example where a delayed clocking scheme and several pipelined gain stages to offer the required quantization gain are required, which is very power hungry and complicated for the design.

Referring now to FIG. 3, an example of a SDM architecture 300 with multi-bit quantization and ELD compensation, according to some examples of the invention, is illustrated. In this example, the SDM architecture 300 includes an input signal 302 whereby a feedback signal 303 is subtracted from the input signal 302 in first summing junction 304. The resultant signal is input to a loop filter 306. The output from the loop filter 306 is input to a series of parallel quantizer paths 307. The number of paths equates to the number of bits of the ADC, with each path equating to the creation of 1-bit.

Each quantizer path 307 includes a transconductance amplifier (Gm) 334 to respectively convert the loop filter's output voltage signal to a current signal. In other examples, any passive or active circuit or component can be used to convert the voltage to current, such as a resistor. Each transconductance amplifier 334 amplifies the filter signal and inputs the amplified signal to a respective second summing junction 308 (on each quantizer path) and a feedback ELD signal subtracted therefrom in respective second summing junctions 308 and a reference current 340 added there to. The analog signals that are output from each of the second summing junctions 308 are input to respective latches 370. The output of each of the latches 370 provides the multi-bit output 314 of the sigma-delta ADC 300. The multi-bit (illustrated as thick lines) digital signal output 314 is fed back 316 to a set of parallel ELD DACs 318, one per quantizer path 307, in order to generate a respective ELD compensation signals to be input to the respective second summing junctions 308. In this example, the ELD DACs 318 are designed to be current-steering DACs, which have current output. Several reference current signals 340 ($I_{ref1}$, $I_{ref2}$, . . . , $I_{refn}$) are needed and are respectively input to second summing junctions 308. In some examples, dependent upon the transfer function being employed, equally spaced reference currents may be used.

In this manner, the loop filter output signal 309 (once converted to current), output current signals from the ELD DACs 318 and each reference current signal 340 are summed in the current domain with their own corresponding summation node 308. Thus, the summation nodes are duplicated.

The resulting current signals directly drive 'n' latches 370. The outputs of the latches 370 are the output of the multi-bit comparator. Thus, in the proposed SDM system 300, with (n+1)-level quantization, 'n' Gm cells 334 and 'n' ELD DACs 318 are required, where every ELD DAC 318 is a (n+1)-level DAC. However, and advantageously in this case, the pre-amplifiers employed in known SDM systems with multi-bit quantization are no longer needed. Thus, the delay that had been previously introduced by these known pre-amplifiers is no longer a problem.

Generally speaking, the function of the latches 370 has three phases: (i) acquiring the initial condition, (ii) regeneration, and (iii) reset. In the conventional system architecture 200 in FIG. 2, the latches have to finish all three phases within one sampling clock period $T_s$. The effective regeneration time is defined as encompassing a time between the comparator latch starting regeneration, and the time the sampler of the latch finishes the sampling. During the effective regeneration time, the comparator latch generates the majority of the required quantization gain for the SDM, for example as the buffers and DAC may also produce some quantization gain. The time to sample and pass the latch output to the ELD DAC and main DAC starts from the moment when the sampler starts to sample the latch output. So the effective regeneration time of the comparator latch, and the time to sample and pass the latch output to the ELD DAC and main DAC have an overlapped time period, which is the time when the latch output sampler is on. In the scenario of very high speed continuous-time Sigma-Delta ADCs, it is preferable to maximize the regeneration time of the latches. Thus, it often requires using very strong reset switches in order to minimize the reset time, which adds load on the output node of the latch.

Thus, in accordance with examples of the invention, local time-interleaved latches 336, 356 are used in the proposed SDM system 300. In this example, for every 1-bit comparator, two latches, e.g. latches 336, 356, form a pair of latches that are configured to be inactivated or activated in a time-interleaved, substantially out-of-synchronisation manner. Thus, each latch from the pair of latches has two phases, namely a first phase of regeneration; and a second phase of reset and taking the next initial condition. In this example, each latch from a pair of latches is operated such that when one latch is in the first phase, the other latch is in second phase. When one latch is in the second phase, input switches 335 are connected, such that the summation result is transferred to the latch as the initial condition. When the latch is in the first phase, for the first more than half time, neither input switches 335 nor output switches 337 are connected, and the latch is re-generating separately from the system. At the end of the first phase, the output switches 337 are connected, and the latch output is sampled. Thus, in this time-interleaved case, the reset time and the time to initial condition is moved out from the originally 1 Ts time budget. In examples of the invention, 2*Ts is available for the latch to perform regeneration, reset, and taking the next initial condition. Regeneration takes 1*Ts. Reset and taking next initial condition happen at the same time, and they take 1 Ts. Hence, the regeneration time of the latches can be maximized, because the regeneration time of one latch is happening whilst the other latch is reset and taking the next initial condition.

In some examples, the SDM and the components or circuits therein, may be implemented in an integrated circuit 360. In other examples, as illustrated in FIG. 4, the SDM and the components or circuits therein may be implemented as a plurality of sliced quantization paths.

Additionally, in the prior art system illustrated in FIG. 2, the summation output ($Q_{in}$) of summing junction 108 needs to drive multiple pre-amplifiers 234. This implies that a large parasitic capacitance is on the node $Q_{in}$, which generates a pole and adds delay in the fast feedback loop. In contrast, in the system illustrated in FIG. 3, the loop filter 306 output drives multiple Gm cells 334. The parasitic capacitance on the loop filter 308 output node also generates a pole, but this pole is advantageously located outside of the multiple fast feedback loops 350. Generally, the outer feedback loop is less sensitive to the extra delay than the fast feedback loops 350. For completeness, the feedback 316 is also fed back to a main DAC 320 to generate an analog version of the output signal 314 in first summing junction 304 and thereby form a feedback loop.

Figure 4:
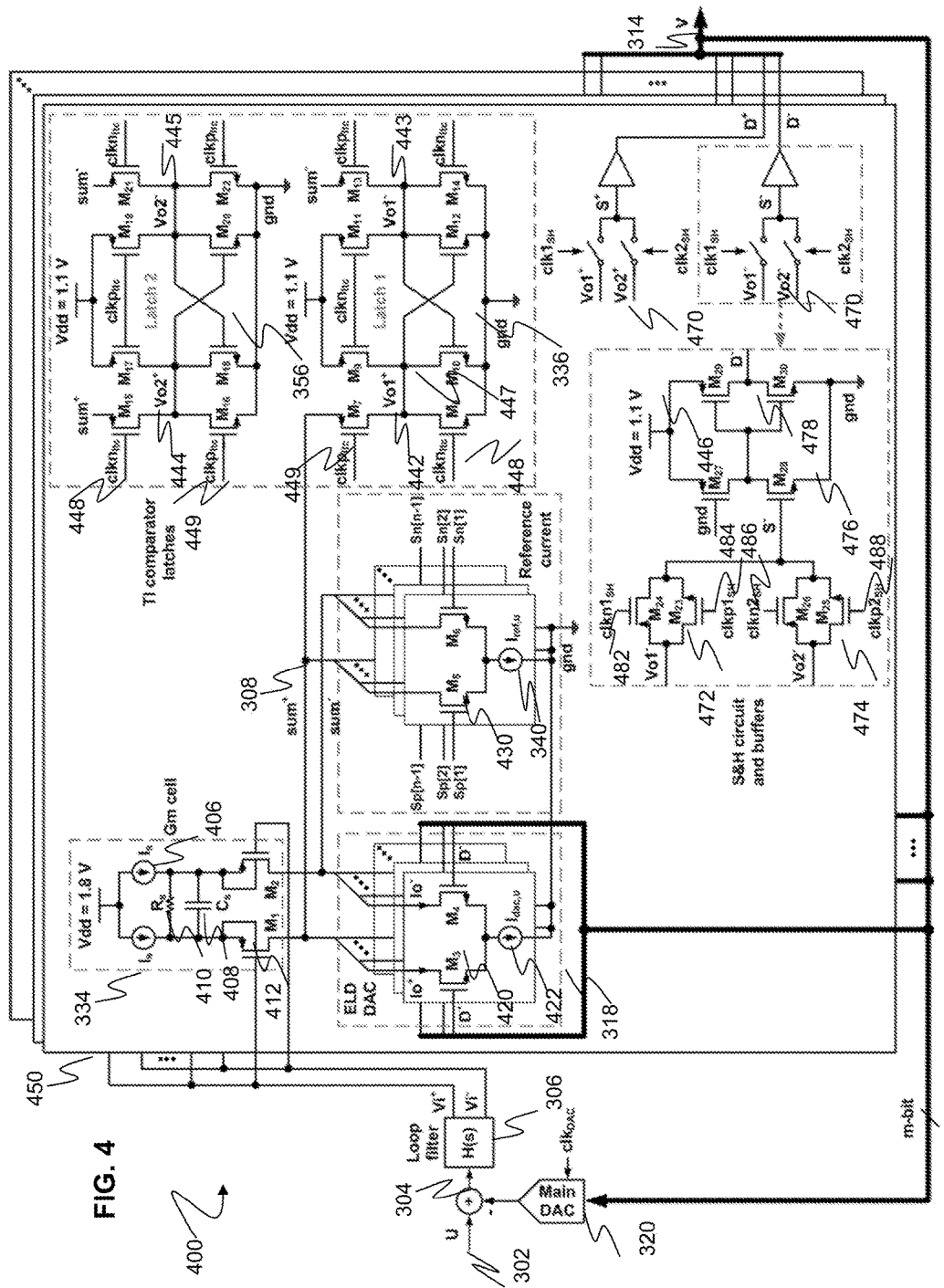
FIG. 4 illustrates an example circuit schematic of a SDM with multi-bit quantization and ELD compensation and local time-interleaved latches, according to some examples of the invention.

Referring now to FIG. 4, an example transistor-level circuit 400 implementation of the proposed current-mode multi-path ELD compensation in a sliced multi-bit SDM, is illustrated according to some examples of the invention. The transistor-level schematics are illustrated with a single-loop SDM architecture, while the proposed ELD compensated multi-bit quantizer can be used in various SDM architectures, including Multi-stAge noise SHaping (MASH) SDM architectures. In the example transistor-level implementation 400, a Gm cell, an ELD DAC 318, an associated reference current 340, two time-interleaved (TI) comparator latches 336, 356, a sample and hold (S&H) circuit and buffers compose a slice of the ELD-compensated quantizer. The transistor-level circuit 400 of the proposed SDM system shows the $m^{th}$ slice of the duplicated summation node and 1-bit comparator in detail. Here we assume the SDM uses (n+1)-level quantization. So the SDM has totally n slices of duplicated summation node and 1-bit comparator.

The loop filter 306 has differential voltage outputs $Vi^+$ and $Vi^-$. These differential voltage signals are converted to differential current signals with a source-degenerated transconductance (Gm) stage 334. The Gm cell is implemented as a source degenerated PMOS transconductance amplifier, which is composed of current sources $I_s$ 406, source-degeneration resistor $R_s$ 410, a capacitor $C_s$ 408 and thin-oxide PMOS transistors $M_1$, $M_2$ 412. Source degeneration is employed to improve the linearity of the Gm cell for a large input swing of ±250 mV. Capacitor $C_s$ is added at the source of $M_1$, $M_2$ 412 to generate a zero in the transfer function of the Gm stage 334 (V/I converter), and to compensate its phase shift/delay. The current source $I_s$ can be for example implemented as cascaded PMOS current source, as shown.

The bandwidth of the Gm cell affects the stability of the outer FB loop, but not the fast FB loop. The ELD DAC 318 is implemented as a current steering DAC. NMOS switches $M_3$, $M_4$ 420 and the current source $I_{dac,u}$ 422 compose a unit ELD DAC 318. NMOS transistors $M_5$, $M_6$ 430 and the current source $I_{ref,u}$ construct a reference current unit 340. Both current sources $I_{dac,u}$ and $I_{ref,u}$ are implemented as cascaded NMOS current sources. For (n+1)-level quantization, 'n' reference levels need to be created, and thus (n−1) reference current units are required for every slice. Complementary digital control signals Sp[1]/Sn[1]-Sp[n−1]/Sn[n−1] per slice 450 can be configured to either Vdd (1.1 V) or ground, which define the reference level of the slice. Among different slices 450, the proposed reference current circuits have the same common-mode current, and only their differential current is different. This property ensures that the circuits in different slices 450 are working in the same common-mode condition.

The transistors $M_9$-$M_{12}$ 336 compose one (first) NMOS latch, while the transistors $M_{17}$-$M_{20}$ 356 compose another (second) NMOS latch. Two complementary clock signals clkp$_{ltc}$ 449 and clkn$_{ltc}$ 448 are needed. In this example, the use of a NMOS latch with PMOS load is designed for maximal quantization gain for the same regeneration time, at the cost of high power consumption.

The transistors $M_7$, $M_8$, $M_{13}$-$M_{16}$, $M_{21}$ and $M_{22}$ compose the switches between the summation nodes (sum+and sum−) and the latch output nodes (Vo1+/− and Vo2+/−470) which are also the latch input nodes). They are also used as the reset switches of the latches. As the reset time is 1 Ts in the proposed system, which is much longer than the state-of-the-art approaches, the requirement on the reset switches are advantageously much relaxed. During the reset phase, the latch output nodes 470 are reset to a common mode voltage plus a differential voltage as the initial condition of the next regeneration. The common-mode voltage is much lower than the threshold voltage of the NMOS, in order to turn off the positive feedback of the NMOS latch. Thus, no extra tail NMOS or PMOS transistor is required to turn off the latch, which is again different to the state-of-the-art high-speed comparators in ADCs, such as M. Bolatkale, L. J. Breems, R. Rutten, and K. A. A. Makinwa, "A 4GHz continuous-time ADC with 70 dB DR and −74 dBFS THD, in 125 MHz BW," IEEE J. Solid-State Circuits, vol. 46, no. 12, pp. 2857-2868, 2011.

This has two advantages. First, the number of transistors between the supply is only two in this design, which is one transistor less than the state-of-the-art high-speed comparators, such as the ones described in M. Bolatkale, L. J. Breems, R. Rutten, and K. A. A. Makinwa, "A 4GHz continuous-time ADC with 70 dB DR and −74 dBFS THD, in 125 MHz BW," IEEE J. Solid-State Circuits, vol. 46, no. 12, pp. 2857-2868, 2011. Thus, the Drain-to-Source voltage $V_{DS}$ is maximized and the transconductance (gm) of the NMOS $M_{10}$, $M_{12}$ is also maximized. Secondly, at the beginning of the regeneration, a large peak current is required to charge the internal nodes of the latch, such that the NMOS $M_{10}$, $M_{12}$ turn on and the positive feedback starts. The tail NMOS or PMOS transistor limits the maximal peak current through the latch. In order to increase the peak current during the start-up of the regeneration, the tail NMOS or PMOS transistor is usually designed as a large device, which increases the load of the latch clock signal, and increases the power consumption of the clock distribution. After the TI comparator latches 336, 356, two transmission gates $M_{23}$-$M_{26}$ 472, 474 with two complementary sampling clocks, clkp1$_{SH}$/clkn1$_{SH}$, clkp2$_{SH}$/clkn2$_{SH}$ 482, 484, 486, 488, are employed to sample the TI latches output at the end of the corresponding latch's regeneration phase, and to hold it on their common output capacitance. The transmission gate samplers, $M_{23}$-$M_{26}$ 472, 474, effectively work as a multiplexer.

In this example, two buffers 476, 478 are inserted between the sampled TI latch output and the input of the ELD DACs 318. The choice of the number of buffers is a trade-off between minimizing the load capacitance of the latch, and reducing the delay of the buffers. The first buffer $M_{27}$, $M_{28}$ 476 is a NMOS buffer with PMOS load, while the 2nd buffer $M_{29}$, $M_{30}$ 478 is a CMOS buffer. The NMOS buffer 476 has lower input capacitance than the CMOS buffer 478, but it consumes more power. The CMOS buffer 478 offers rail-to-rail driving ability. For the (n+1)-level quantization, one sampled latch output node should drive 'n' unit ELD DACs after two buffers.

The reference current across all slices is designed to have the same common-mode current for every slice, i.e. $I_{refp,1}+I_{refn,1}=I_{refp,2}+I_{refn,2}=\ldots=I_{refp,n}+I_{refn,n}$. The differential reference current signal $I_{refp,m}-I_{refn,m}$ is different for every slice. The source-degenerated Gm stages, the connection circuit, the latches, and the samplers are exactly the same for these 'n' slices.

The $m^{th}$ ELD DAC 318 is an (n+1)-level current steering DAC. The ELD DACs 318 are implemented similarly as the reference current, but their switches are controlled by the digital output of the (n+1)-level comparator. The current sources in the reference current and ELD DACs 318 can be for example implemented as cascaded NMOS current sources. In these examples, the source-degenerated Gm stages, the connection circuit, the latches, and the samplers are exactly the same for each of the 'n' slices.

For the correct operation of the ELD compensation, the (n+1)-level ELD DACs 318 output current should be able to react on the new (n+1)-level comparator output, before the starting point of the next regeneration phase. This means that for one sampled comparator input, its output changes, from the starting time of the regeneration phase, to the time the ELD DAC 318 output current updates, and the total time delay should be less than 1 $T_s$. Otherwise the ELD DAC feedback is too late, and the SDM becomes unstable.

Figure 5:
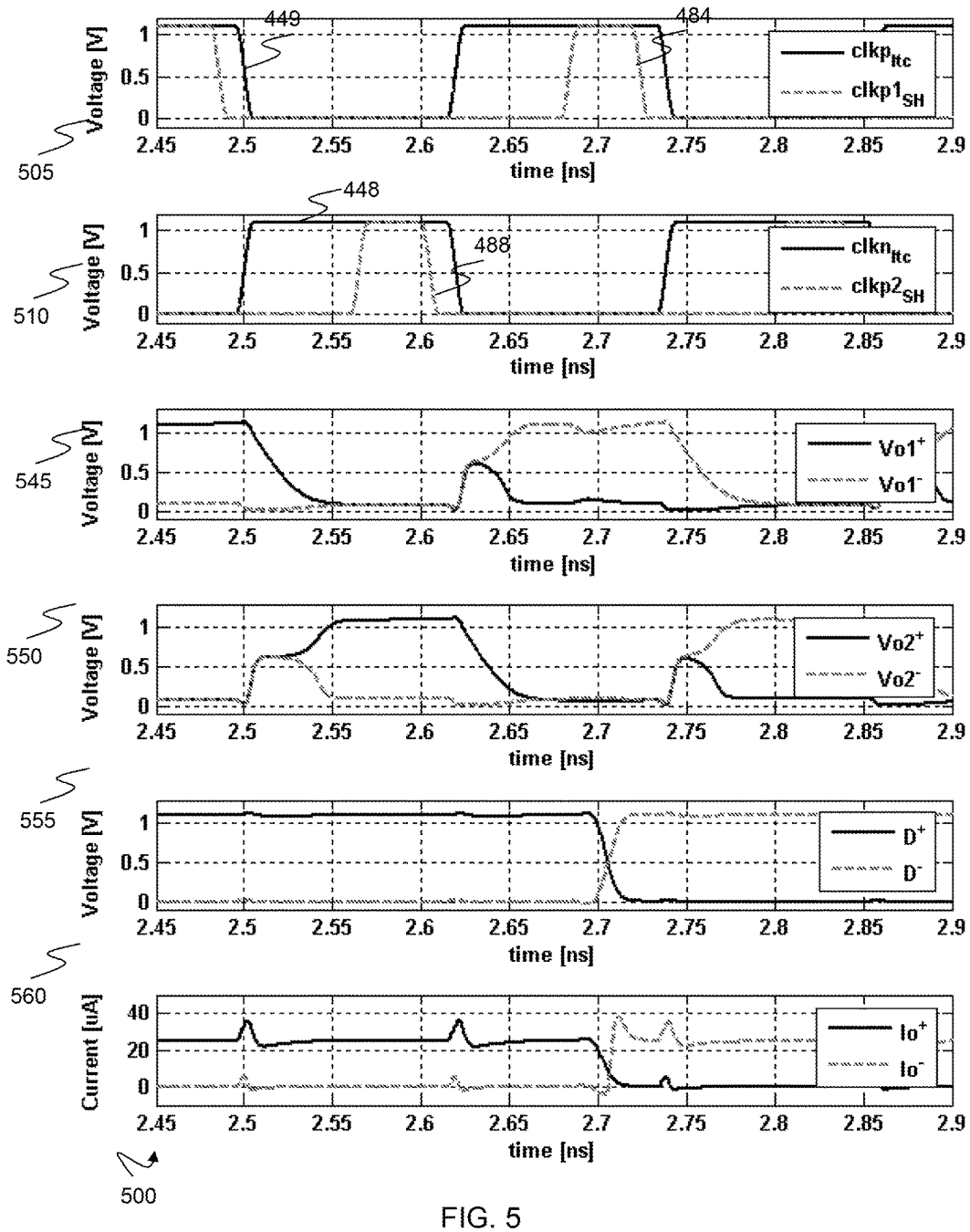
FIG. 5 illustrates an example set of waveforms that clarify one example clock diagram and signal behaviour of the local time-interleaved latches, according to some examples of the invention.

The operation of FIG. 3 and FIG. 4 can also be understood from an example set of waveforms, as illustrated in FIG. 5, which clarify one example of the signal behaviour of some important signals in the proposed SDM system according to some examples of the invention. FIG. 5 shows a first clock waveform 505 that is applied to one of the latch paths, say the latch path that includes switches 335, 337 and latch 336 in FIG. 3. This waveform 505 includes a first latch clock waveform (clkp$_{ltc}$) 449, and a first sampling clock signal (clkp1$_{SH}$) 484. FIG. 5 also shows a second clock waveform 510 that is applied to a second of the latch paths, say the latch path that includes switches 355, 357 and latch 356 in FIG. 3. Here, the second waveform 510 includes a second latch clock waveform (clkn$_{ltc}$) 448, and a second sampling clock signal (clkp2$_{SH}$) 488.

The latch clock signals clkp$_{ltc}$ 449 and clkn$_{ltc}$ 448 are complementary. They are at the half of the SDM sampling rate, which in this example is 4.2 GHz. and they are with a 50% duty cycle. When clkp$_{ltc}$ 449 is high (1.1V) and clkn$_{ltc}$ 448 is low (0 V), the first latch is in a regeneration phase, and the second latch is resetting and taking the next initial condition. In this phase, the summation result of loop filter output 306, ELD DAC output 318, and reference current 340 is transferred to the second latch as the initial condition of the next regeneration. On the contrary cycle, when clkp$_{ltc}$ 449 is low, the second latch is in the regeneration phase, and the first latch is resetting and taking the next initial condition.

The 3rd and 4th waveforms 545, 550 depict the differential output signal of the first latch and the second latch, respectively. At the end of the regeneration phase of the first latch (or second latch), the corresponding sampling clock signal clkp1$_{SH}$ 484 (or clkp2$_{SH}$ 488) becomes high, and the first latch (or second latch, dependent on the point in the cycle) output is sampled. The clkp1$_{SH}$ 484 (or clkp2$_{SH}$ 488) should become low before resetting the first latch (or second latch).

The 5th and 6th waveforms 555, 560 show the input voltage and the output current of a unit ELD DAC 318, respectively. Since the total delay of the fast FB loop should be less than 1 $T_s$ (119 psec. in this example), the output current of the ELD DAC 318 must settle before the starting of the next regeneration of either latch. Moreover, the total delay of the current summation and the switches between the summation node and the latch must be very short, such that the ELD feedback information reaches the latch before the start of the next regeneration. In other words, at the starting moment of the next regeneration, which is the sampling moment of the quantizer, the ELD feedback information of the previous sample must already change the latch initial condition, and this change must be settled. In FIG. 5, the output current of the ELD DAC 318 is settled about 15 psec. before the next positive clock edge of clkp$_{ltc}$ 449 or clkn$_{ltc}$ 448, which is a tradeoff between maximizing the effective regeneration time of the latch, and the robustness of the ELD feedback loop.

Thus, when viewed with the circuit of FIG. 4, the operation principle of the proposed schematic is as follows. When clkp is high (and clkn is low), Latch-1 336 (composed of $M_9$-$M_{12}$) is in the regeneration phase, and latch-2 356 (composed of $M_{17}$-$M_{20}$) is in the resetting and tracking initial condition phase. In this case, the function of the N-bit (which in this example is a 1-bit) comparator (latch) is locally time-interleaved. The source-regenerated Gm stage, ELD DAC 318, and reference current 340 are always working. The summation nodes (sum$^+$, sum$^-$) are connected to one of the two latches (in the resetting and tracking initial condition phase). In this example, the summation nodes are relatively stable, except for the transition of the switches (connection circuit).

For latch-1, its connection circuit ($M_7$, $M_8$, $M_{13}$, $M_{14}$) is 'off'. In the beginning of the regeneration phase (when clkp$_{ltc}$ is high and clkp1$_{SH}$ is low), the samplers connected to the outputs of latch-1 are also 'off'. In this period, the voltages of the output nodes of latch 1 (Vo1$^+$, Vo1$^-$) are completely determined by the strong positive feedback of latch-1. So the regeneration of the latch is very fast. In the end of the regeneration phase of latch-1, the clock for the samplers clkp1$_{SH}$ becomes high, and the samplers connected to latch 1 outputs turn on. The latch-1 outputs are sampled and stored properly. In examples of the invention, clkp1$_{SH}$ is configured to go low before clkp$_{ltc}$ goes low, to avoid resetting of the sampled latch-1 output signal.

When clkp$_{ltc}$ becomes low (and clkn$_{ltc}$ becomes high), latch-1 starts to reset. In this period, its connection circuit ($M_7$, $M_8$, $M_{13}$, $M_{14}$) is 'on', and the PMOS transistors of latch-1 ($M_9$, $M_{11}$) is off. Both a common-mode current and a differential current go through the connection circuit. The differential current is actually the summation result of the loop filter output differential current signal (the differential drain current signal of $M_1$ and $M_2$), ELD DAC 318 output differential current signal, and reference differential current signal. The common-mode current through the connection circuit is the common-mode current through the source-degenerated Gm stage ($I_s$) 334, minus the common-mode current of the ELD DAC 318 and common-mode reference current. The latch output node is reset to a common-mode voltage level determined by the connection circuit. At the same time, a differential voltage is created on the latch output nodes, which is determined by the differential current signal through the connection circuit. When the next regeneration phase starts (clkp$_{ltc}$ becomes high), the differential voltage signal at the latch output nodes at that time moment creates the initial condition for this new regeneration phase.

From the clock diagram and operation principle in FIG. 4 and FIG. 5, we can see the following advantages of the proposed solution, compared with the conventional circuit architecture (in FIG. 2). Firstly, since the pre-amplifier is no longer part of the system, the delay of the pre-amplifier is saved. Secondly, since the N-bit/1-bit comparator (latch) is locally time-interleaved, it has 2 $T_s$ to finish three operations (i.e. achieve the initial condition, regeneration, reset), instead of 1 $T_s$.

Hence, the time to reset and to obtain the initial condition is not in the 1 $T_s$ time budget. Thus, 1 $T_s$ can be completely used for the regeneration phase, and the effective regeneration time of the comparator can be maximized. Thirdly, the clocking scheme is simpler than the conventional delayed-clocking scheme proposed by M. Bolatkale, L. Breems, R. Rutten and K. Makinwa. It shows the potential for more power efficient clock generation and distribution.

Figure 6:
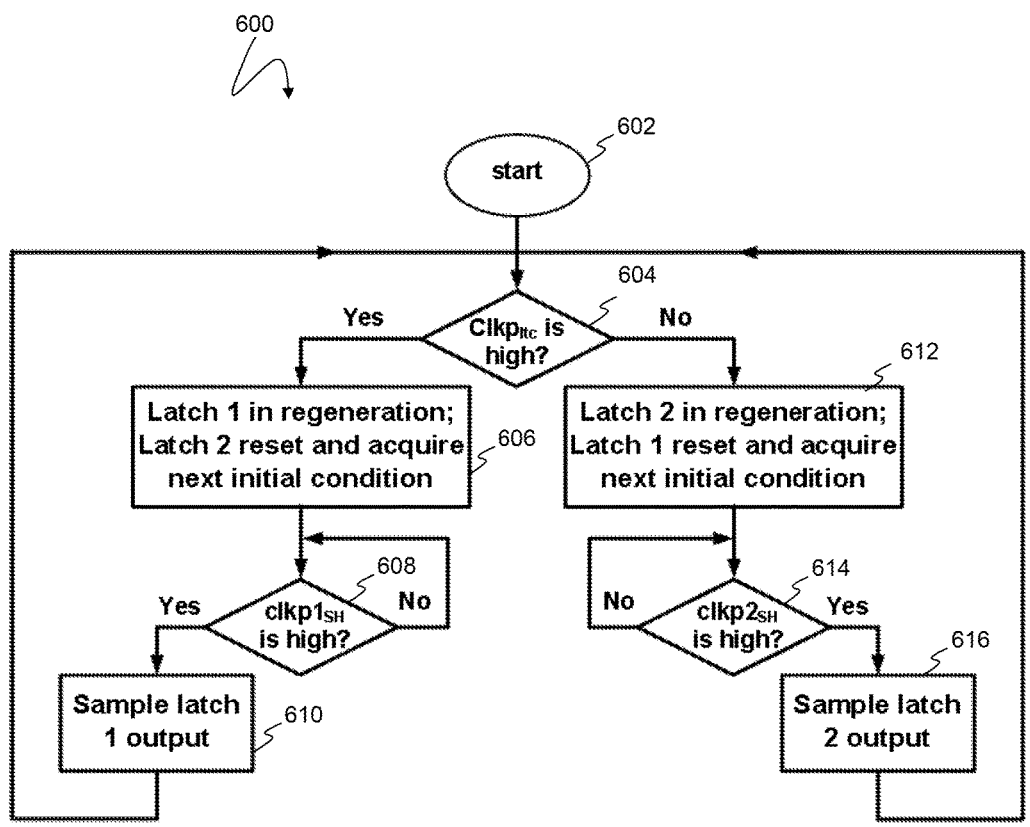
FIG. 6 illustrates an example flow chart of a SDM system with multi-bit quantization and ELD compensation and local time-interleaved latches, according to some examples of the invention.

FIG. 6 illustrates an example flowchart 600 of a SDM system with multi-bit quantization and ELD compensation and local time-interleaved latches, according to some examples of the invention. In this example, it is envisaged that the loop filter output (in FIG. 3 and FIG. 4) is in a voltage domain, in accordance with known continuous-time Sigma-Delta ADCs. After the loop filter output is fed through one or more transconductance amplifiers (Gm cells), the loop filter output is in a current domain. A combination of the loop filter output current signal, an ELD DAC output current and a reference current are summed, in each of one or a plurality of paths. The summation result is passed to one latch from a pair of latches as an initial condition.

The flowchart 600 starts at 602 and at 604, a determination is made (say in the circuit of FIG. 4 or FIG. 5) as to whether the clock signal clkp$_{ltc}$ is high. In this example, at 606, if the clock signal is high, latch-1 is configured to be in a regeneration mode whereas latch-2 is configured to be in a reset-mode and acquiring the next initial condition. Whilst the respective output switch is open, i.e. the sampling clock clkp1$_{SH}$ is 'low', the flowchart loops at 608. When the respective output switch is closed, i.e. the sampling clock clkp1$_{SH}$ is 'high', the flowchart at 608 moves to 610, whereby the latch-1 output is sampled, and the flowchart loops back to 604.

Similarly, in this example and at 612, if the clock signal clkp$_{ltc}$ is low, latch-2 is configured to be in a regeneration mode whereas latch-1 is configured to be in a reset and mode and acquire the next initial condition. Whilst the respective output switch is open, i.e. the sampling clock clkp2$_{SH}$ is 'low', the flowchart loops at 614. When the respective output switch is closed, i.e. the sampling clock clkp2$_{SH}$ is 'high', the flowchart at 614 moves to 616, whereby the latch-2 output is sampled, and the flowchart loops back to 604.

It is envisaged that in other examples, alternative circuits and components may be employed that utilise the concepts herein before described. For example, it is envisaged that different types of DAC architecture may be employed as the design is not limited to use of current-steering DACs. Furthermore, in other examples, the loop filter may take different forms, e.g. a feedback filter or feedforward filter.

In some examples, a single feedback path may be used. In other examples, as illustrated, multiple paths to multiple separate ELD DACs may be used. In this manner, a use of multiple paths to multiple separate ELD DACs may be employed to optimise the circuit for best timing.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed. Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality. Furthermore, those skilled in the art will recognize that boundaries between the above described operations merely illustrative. The multiple operations may be combined into a single operation, a single operation may be distributed in additional operations and operations may be executed at least partially overlapping in time.

Moreover, alternative embodiments may include multiple instances of a particular operation, and the order of operations may be altered in various other embodiments. Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner. Also for example, the examples, or portions thereof, may implemented as soft or code representations of physical circuitry or of logical representations convertible into physical circuitry, such as in a hardware description language of any appropriate type. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A multi-bit continuous-time sigma-delta modulator, SDM, comprising:
   an input configured to receive an input analog signal;
   a first summing junction (304) configured to subtract a feedback analog signal from the input analog signal;
   a loop filter configured to filter an output signal from the first summing junction;
   an analog-to-digital converter, ADC, configured to convert the filtered analog output signal to a digital output signal; and
   a feedback path for routing the digital output signal to the first summing junction, wherein the feedback path comprises a plurality of digital-to-analog converters, DACs, configured to convert the digital output signal to an analog form; wherein the multi-bit SDM is characterised in that the ADC comprises a plurality of N-bit comparator latches that are each locally time-interleaved with at least a pair of latches configured to function in a complementary manner and provide a combined complementary output.

2. The multi-bit continuous-time SDM of claim 1, wherein the pair of latches are configured to provide a complementary output that comprises alternate latches of the pair being inactivated or activated in an out-of-synchronisation manner.

3. The multi-bit continuous-time SDM of claim 1, wherein the complementary arrangement between the paired latches comprises a first latch of the pair of latches being configured to be in a regeneration mode concurrently with a second latch of the pair of latches being configured to be in a reset mode and acquiring a next initial condition.

4. The multi-bit continuous-time SDM of claim 3, wherein the complementary arrangement between the pair of latches provides a first ADC sampling period for regeneration and a second ADC Ts for a reset operation and to take the next initial condition.

5. The multi-bit continuous-time SDM of claim 4, wherein the reset operation and taking the next initial condition happens in series.

6. The multi-bit continuous-time SDM of claim 4, wherein the reset operation and taking the next initial condition happens in parallel.

7. The multi-bit continuous-time SDM of claim 1, wherein the multi-bit SDM is further characterised in that the ADC comprises multiple per-bit parallel loops comprising a plurality of paths, each path comprising a pair of latches coupled to an output of a current summing junction and configured to provide a one-bit contribution to the digital output signal.

8. The multi-bit continuous-time SDM of claim 7, wherein the multi-bit SDM is characterised in that the ADC multiple per-bit parallel loops comprise a plurality of paths, each path comprising:
   a voltage-to-current converter configured to receive the filtered analog output signal in voltage domain and convert the filtered analog output signal into a current domain;
   a DAC configured to selectively convert one bit of the multi-bit quantization digital output signal to an analog form; and
   a current summing junction configured to sum a current domain representation of the filtered analog output signal, a current domain representation of the multi-bit quantization digital output signal from the DAC; and a dedicated reference current for each path.

9. The multi-bit continuous-time SDM of claim 8, wherein the DAC in each loop comprises an excess loop delay, ELD, DAC configured to selectively convert one bit of the digital output signal to an analog form.

10. The multi-bit continuous-time SDM of claim 1, wherein the plurality of paths is a plurality of quantizer paths with each path comprising a transconductance amplifier.

11. The multi-bit continuous-time SDM of claim 1, wherein the plurality of N-bit comparator latches comprise a plurality of 1-bit comparator latches.

12. The multi-bit continuous-time SDM of claim 1, wherein the multi-bit continuous-time SDM is formed across a plurality of slices comprising a 1-bit ADC, such that a reference current circuit provides the same common-mode current across different slices and where only the differential current is different across different slices.

13. An integrated circuit comprising a multi-bit continuous-time sigma-delta modulator, SDM, comprising:
   an input configured to receive an input analog signal;

a first summing junction configured to subtract a feedback analog signal from the input analog signal;

a loop filter configured to filter an output signal from the first summing junction:

an analog-to-digital converter, ADC, configured to convert the filtered analog output signal to a digital output signal; and a feedback path for routing the digital output signal to the first summing junction, wherein the feedback path comprises a plurality of digital-to-analog converters, DACs, configured to convert the digital output signal to an analog form; wherein the multi-bit SDM is characterised in that the ADC comprises a plurality of N-bit comparator latches that are each locally time-interleaved with at least a pair of latches configured to function in a complementary manner and provide a combined complementary output.

14. A method for generating a multi-bit quantization digital output signal by a multi-bit continuous-time sigma-delta modulator, SDM, the method comprising:

receiving an input analog signal;

subtracting a feedback analog signal from the input analog signal in a first summing junction;

filtering an output signal from the first summing junction:

converting the filtered analog output signal to a digital output signal in an analog-to-digital converter, ADC;

feeding back the digital output signal to the first summing junction, via a digital-to-analog converter, DAC, converting the digital output signal to an analog form;

wherein the method is characterised by:

operating a plurality of N-bit paired latches in a complementary manner; and providing a combined complementary output from the plurality of paired latches.

15. The method of claim 14, further comprising:

inactivating or activating in an out-of-synchronisation manner respective latches from the paired latches; and providing a complementary output from the plurality of paired latches by alternately coupling the respective latches to an output of the SDM.

* * * * *